United States Patent [19]

Ice

[11] 4,013,949
[45] Mar. 22, 1977

[54] RETURN LOSS TEST SET

[75] Inventor: George E. Ice, San Carlos, Calif.

[73] Assignee: GTE Automatic Electric Laboratories Incorporated, Northlake, Ill.

[22] Filed: Feb. 9, 1976

[21] Appl. No.: 656,502

[52] U.S. Cl. .............................. 324/58 B; 324/62; 324/DIG. 1; 179/175.3 R
[51] Int. Cl.² ...................................... G01R 27/04
[58] Field of Search .......... 324/58 B, 62 R, DIG. 1; 178/5; 179/175.3

[56] References Cited
UNITED STATES PATENTS

| | | | |
|---|---|---|---|
| 2,953,632 | 9/1960 | Benewicz et al. | 178/5 |
| 3,479,587 | 11/1969 | MacKenzie et al. | 324/58 B |
| 3,800,218 | 3/1974 | Shekel | 324/58 B |

*Primary Examiner*—Stanley T. Krawczewicz
*Attorney, Agent, or Firm*—Russell A. Cannon; Leonard R. Cool; David W. Heid

[57] ABSTRACT

In this test set, each one of a pair of resistive bridges has one node thereof connected to ground, one of the arms of each bridge that is adjacent the one nodes being open. Each one of a pair of ungrounded terminals of a balanced circuit under test is connected to a different one of the ungrounded nodes associated with the open arms of the bridges. Any center ground terminal of the test circuit is connected to the one nodes, which are grounded. Equal amplitude test signals of the same phase are applied to the pair of nodes on the two bridges that are adjacent to the one nodes thereof. A reflected signal coupled from the pair of nodes on the two bridges that are opposite the one nodes thereof is applied to a VTVM which provides an indication of the return loss of the test set, in relation to the individual bridge resistances which are the same values.

9 Claims, 3 Drawing Figures

RETURN LOSS TEST SET

FIELD OF INVENTION

This invention relates to test apparatus and more particularly to apparatus for testing the return loss of a balanced circuit that is to operate into a load having a prescribed input impedance. The test apparatus here will measure the reflection coefficient of balanced circuits with and without center grounds.

DESCRIPTION OF DRAWING

This invention and a prior-art test set will be more fully understood from the following descriptions, together with the drawing in which.

DESCRIPTION OF PRIOR ART

Reflection loss is a decibel measure of the loss in transmitting power from one circuit to another, which occurs when the driving impedance is not equal to the load resistance. Return loss is a decibel measure of the dissimilarity between two impedances and is representable as $20 \log_{10}(1/\rho)$, where $\rho$ is the reflection coefficient. In a given network, reflection loss and return loss are numerically equal. The return loss essentially tells how well the output impedance of a first circuit is matched to the input impedance of a second circuit. It is a measure of the amount of signal that is transmitted from a given circuit to an associated circuit. An infinite return loss indicates that the output impedance of the given circuit is equal to the input impedance of the associated circuit. The reflection coefficient is the ratio between the amplitude of a reflected wave and the amplitude of an incident wave, and has a magnitude of less than one. It is also a measure of the output impedance $Z_o$ of a given circuit with respect to the input impedance $Z_i$ of an associated circuit and in terms of these two impedances is representable as $\rho = (Z_i - Z_o)/(Z_i + Z_o)$. The magnitude of the reflection coefficient can be read directly from scales on a vacuum-tube voltmeter (VTVM) in a manner that is well known in the art.

Figure 1:
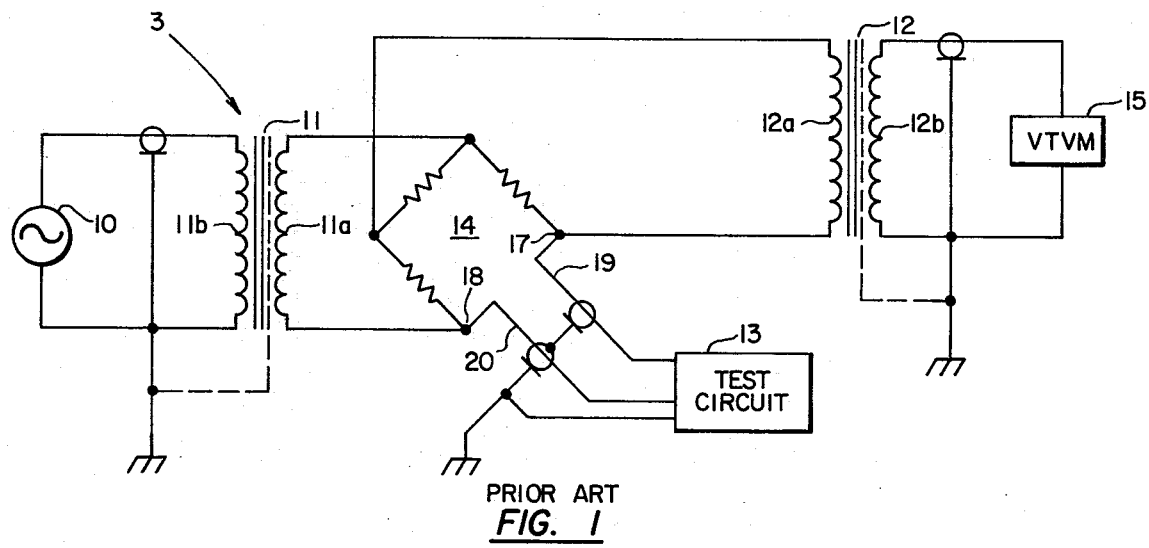
FIG. 1 is a schematic circuit diagram of a prior-art test set.

The prior-art test set 3 in FIG. 1 comprises an unbalanced oscillator 10, a pair of unbalanced-to-balanced transformers 11 and 12, a single resistive bridge 14, and a VTVM 15. The balanced secondary windings 11a and 12a of the transformers are connected to different nonadjacent pairs of nodes of the resistive bridge 14. Grounded primary windings 11b and 12b of the transformers are coupled to the oscillator 10 and the VTVM 15, respectively. Terminals of a circuit 13 under test are connected to adjacent nodes 17 and 18 of the bridge 14 and to ground (where and when appropriate). Elements of the test set 3 have particular values that are selected in relation to the desired impedance (which is also equal to the prescribed impedance) of the circuit 13 under test. Elements in the test set are made to have different values in order to test circuits having different values of desired impedance. The test signal provided by the unbalanced oscillator 10 is coupled through transformer 11 to the resistive bridge 14. A reflected signal, which is a measure of the reflection loss presented by the circuit 13 under test and the impedance thereof across lines 19 and 20, is coupled through the transformer 12 to VTVM 15 which produces an indication of the reflection loss of the test circuit 13. This prior-art test set 3 provides a measure of the return loss of either a balanced circuit 13 with a center ground or a balanced circuit without a center ground. Although such a prior-art test set 3 will operate to test either balanced circuits with center grounds or balanced circuits without center grounds, the same test set 3 according to this design does not operate satisfactorily for testing both types of balanced circuits.

DESCRIPTION OF PREFERRED EMBODIMENTS

Figure 2:
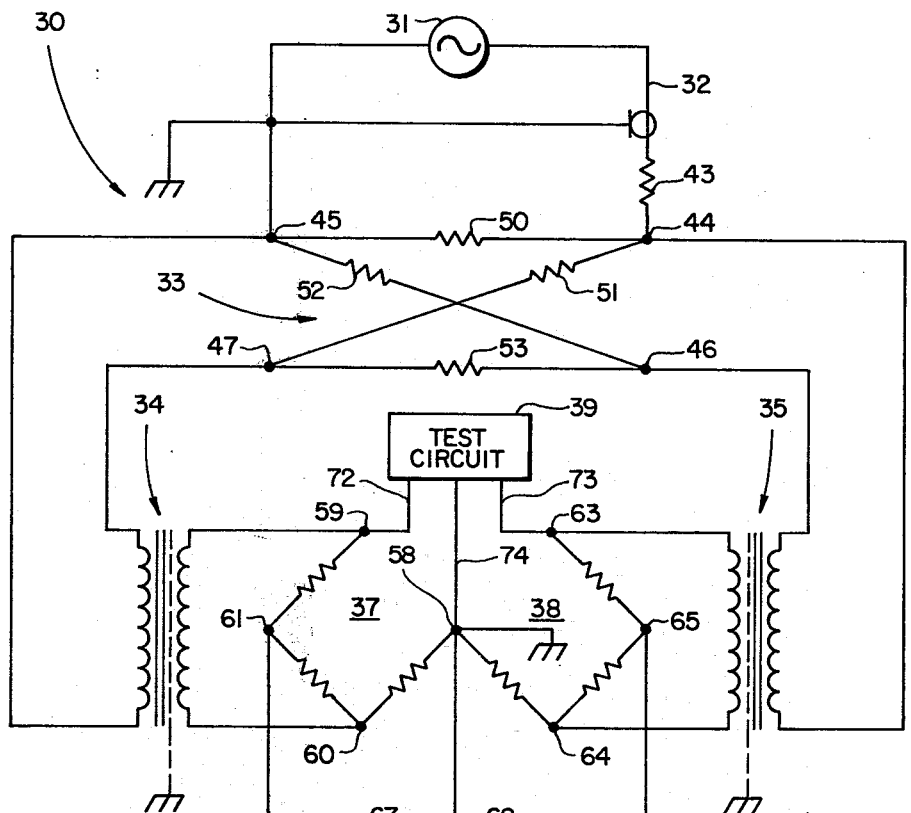
FIG. 2 is a schematic circuit diagram of a test set embodying this invention.

A test set 30 embodying this invention is illustrated in FIG. 2. The test set 30 will be described for testing a balanced circuit 39 having an output impedance of 124 ohms, for example, measured across a pair of ungrounded output terminals 72 and 73 thereof. This circuit 39 has an impedance of 62 ohms between each of the terminals 72 and 73 and ground. Although the test circuit 39 in FIG. 2 has a grounded center terminal 74, this test set will also test balanced circuits without grounded center terminals. The test set 30 may be designed to test the return loss of circuits having output impedances other than 124 ohms by adjusting the impedance levels of elements thereof in a manner well known in the prior art.

The test set 30 comprises an oscillator 31 feeding a 62-ohm resistive hybrid 33 through a coaxial cable line 32 having the outer conductor thereof connected to ground, a pair of input transformers 34 and 35, a pair of 62-ohm resistive bridges 37 and 38 which are coupled to the circuit 39 under test, an output transformer 40, and a VTVM measuring device 41. The oscillator 31 has a 75-ohm output impedance, for example, and produces a constant amplitude signal over a range of frequencies. The output signal of the oscillator 31 is coupled through line 32 and resistor 43 to the node 44 of the one or input port 44, 45 of the resistive hybrid 33, the other node 45 of the one port also being connected to ground. A resistor 50 is connected between nodes 44 and 45. The resistors 43 and 50 comprise a minimum-loss resistive pad for converting the 75-ohm output impedance of oscillator 31 to 62 ohms across the input port 44, 45 of the hybrid. The 62-ohm resistive hybrid 33 comprises a pair of 62-ohm resistors 51 and 52 that are coupled to the nodes 44 and 45, respectively, thereof. A balancing network comprising a 62-ohm resistor 53 is connected across the hybrid port 46, 47 opposite the one port. A signal across the hybrid input port 44, 45 produces signals of equal amplitude and the same phase across the opposing output ports 44, 46 and 45, 47 thereof, which are connected to the primary windings of associated transformers 35 and 34, respectively.

The input transformers 34 and 35 are balanced transformers with 1:1 turns ratios. The impedances across the primary and secondary windings of these transformers are both 62 ohms in order to provide an impedance match to associated hybrid ports and the resistive bridges. In an embodiment of this invention that was successfully operated, the transformers 34 and 35 each included an electrostatic shield that was connected to ground as is indicated by the dashed lines in FIG. 2. Although such a shield is desirable, it is not believed to be essential.

Each of the 62-ohm resistive bridges 37 and 38 comprises three each 62-ohm resistors, one leg of each bridge being open. The opposing nodes 59 and 60 of bridge 37 are connected to the secondary winding of transformer 34. Similarly, the opposing nodes 63 and 64 of bridge 38 are connected to the secondary winding of transformer 35. These bridges 37 and 38 are essentially electrically connected in series, the bridges being directly electrically connected together at only one point, i.e., node 58 of the test legs thereof. This common node 58 is also connected to ground.

The output transformer 40 is also a balanced transformer. This transformer 40 has a center-tapped secondary winding 67 that is connected across the series combination of the two bridges, i.e., to nodes 61 and 65 of the latter, the center tap 68 being connected to ground. The primary winding 70 of the output transformer 40 is connected through coaxial cable line 71 to VTVM 41. The outer conductor of cable 71, as well as one side of the primary winding 70 and the VTVM, is connected to ground. An electrostatic shield of the transformer 40 is also connected to ground. The impedances of the primary and secondary windings of transformer 40 are 75 ohms and 124 ohms in order to match the impedances of the VTVM and the combined impedances of the bridges, respectively.

The balance of the test set 30 is checked by either connecting a single 124-ohm resistor (this resistance being equal to the combined resistances of the two bridges 37 and 38) across nodes 59 and 63, or connecting individual 62-ohm resistors between nodes 58 and 59 and between nodes 58 and 63.

In order to test the return loss of a circuit 39, the ungrounded output terminals 72 and 73 of the latter are connected to the nodes 59 and 63, respectively, of the test legs of the two bridges. The grounded center terminal 74 (if any) of the test circuit 39 is electrically connected to the common grounded node 58 of the test legs. If the test circuit 39 does not have a common grounded terminal 74, no connection is required between this circuit 39 and node 58. The test set will still measure the return loss of such a circuit 39 that does not have a grounded center terminal.

In operation, a circuit 39 under test is connected to some or all of the nodes 58, 59, and 63 of the test set 30. Oscillator 31 is adjusted to produce an AC signal of a prescribed level and of a frequency at the low end, for example, of a frequency band over which it is desired to test the return loss of this circuit 39. The AC signal divides in hybrid 33 and is passed through transformers 34 and 35 such that equal amplitude test signals of the same phase are applied across input nodes 59, 60 and input nodes 63, 64 of bridges 37 and 38, respectively. The reflected signal at nodes 61 and 65 of the bridges is coupled through transformer 40 to the VTVM which provides an indication of the return loss of the test circuit 39 at the given frequency. The oscillator 31 is adjusted to vary the frequency of the test signal, while the amplitude thereof is maintained constant, in order to test the performance of the circuit 39 over the desired frequency band.

In a test set 30 which was built and operated satisfactorily over a frequency band from 5 kHz to 10 MHz, the various elements had the following values:

| Element | Ohms |
| --- | --- |
| R43 | 31.6 Ω |
| R50 | 150 Ω |
| R51 | 62 Ω |
| R52 | 62 Ω |
| R53 | 62 Ω |
| Bridge resistors | 62 Ω |
| Node 61–65 resistance | 124 Ω |
| Desired impedance | 124 Ω |

Figure 3:
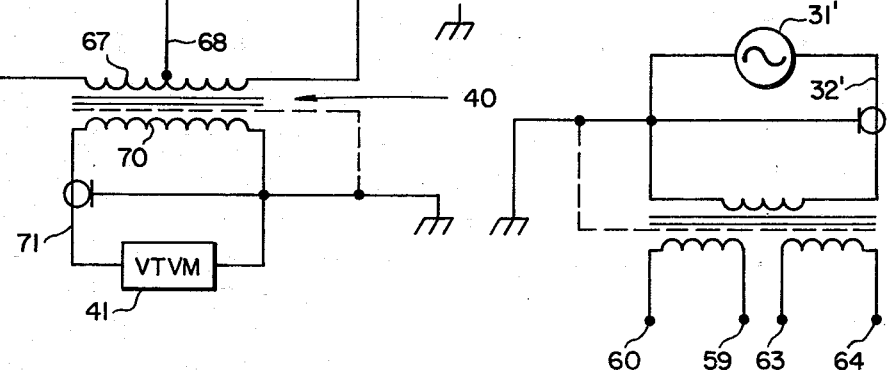
FIG. 3 is a schematic circuit diagram of an alternate embodiment of this invention.

Although this invention is described in relation to a preferred embodiment thereof, variations and modifications will occur to those skilled in the art without departing from the spirit of this invention. By way of example, this test set may be employed to test various types of balanced circuits such as filters, resistive networks, terminated cables, and amplifiers. This test set will also operate for measuring the output impedance of a balanced circuit 39 with respect to a prescribed impedance which is different from 124 ohms by adjusting the values of the elements of the test set in relation to the desired-prescribed impedance. Although the output transformer 40 is shown as having a secondary winding with a center tap that is connected to ground, it is not necessary that this center tap be connected to ground. Further, alternate structure for coupling equal amplitude signals of the same phase to the bridges is illustrated in FIG. 3. The scope of this invention is therefore to be determined from the attached claims rather than from the above detailed description of preferred embodiments thereof.

What is claimed is:

1. Apparatus for testing the return loss of a balanced circuit under test having at least a pair of terminals which are ungrounded and are to operate into a load having a prescribed impedance, some balanced circuits under test also having a grounded center terminal, said apparatus comprising:
   a pair of resistive bridges each having a bridge resistance which is equal to one half of the value of the prescribed impedance, one nodes of each of said bridges being electrically connected together and to a ground reference potential, one arm between said one node and an other node of each of said bridges being open;
   first means connecting the pair of ungrounded output terminals of the test circuit to associated ones of said other nodes of said bridges, any center ground terminal of the test circuit being connected to said one nodes of said bridges;
   second means for producing an indication which is a measure of the return loss of the circuit under test;
   third means producing an AC test signal;
   fourth means responsive to the output of said third means for coupling equal amplitude test signals of the same phase to said bridges; and
   fifth means coupling a reflected output signal from the two nodes of said bridges that are opposite said one nodes and applying this reflected signal to said second means for providing an indication of the return loss of the test circuit.

2. Apparatus according to claim 1 wherein said third means is tunable for varying the frequency of the test signal over a band of frequencies.

3. Apparatus according to claim 2 wherein said fourth (coupling) means comprises:

a pair of balanced input transformers each having a primary and a secondary winding; the impedances of said secondary windings thereof both being equal to one half the value of the prescribed impedance; the impedances of said primary windings thereof having the same values; said secondary windings thereof being electrically connected to associated ones of said bridges; and a four-port resistive hybrid having a value equal to the values of the impedances of the primary windings of said input transformers, one port of said hybrid being electrically connected to the output of said third means, the hybrid port opposite said one port being electrically connected to a balancing network having an impedance equal to that of said hybrid; the other pair of ports of said hybrid being electrically connected to associated primary windings of said input transformers.

4. Apparatus according to claim 3 wherein each of said input transformers includes an electrostatic shield which is electrically connected to ground.

5. Apparatus according to claim 2 wherein said fifth means comprises a balanced output transformer having a primary and a secondary winding, the impedance of said secondary winding being equal to twice the impedance of one of said bridges, the impedance of said primary winding being equal to that of said second means; said output secondary winding being coupled to the nodes of said bridges that are opposite said one nodes thereof, said output primary winding being coupled to said second (measuring) means.

6. Apparatus according to claim 5 wherein the secondary winding of said output transformer includes a center tap which is electrically connected to ground.

7. Apparatus according to claim 6 wherein said output transformer includes an electrostatic shield which is electrically connected to ground.

8. Apparatus according to claim 2 wherein said fourth means comprises a balanced input transformer having a primary winding electrically connected to said third means and receiving the AC test signal, and having a pair of secondary windings, each of said secondary windings being electrically connected to a different one of said pair of resistive bridges; the impedances of both of said secondary windings of said input transformer being equal to the impedance of the associated bridge; the impedance of the primary winding of said input transformer being matched to that of said third means.

9. Apparatus according to claim 8 wherein said input transformer includes an electrostatic shield which is electrically connected to ground.

* * * * *